US007649230B2

(12) United States Patent
Shin et al.

(10) Patent No.: US 7,649,230 B2
(45) Date of Patent: Jan. 19, 2010

(54) COMPLEMENTARY FIELD-EFFECT TRANSISTORS HAVING ENHANCED PERFORMANCE WITH A SINGLE CAPPING LAYER

(75) Inventors: Kyoungsub Shin, Walnut Creek, CA (US); Tsu-Jae King, Fremont, CA (US)

(73) Assignee: The Regents of the University of California, Oakland, CA (US)

( * ) Notice: Subject to any disclaimer, the term of this patent is extended or adjusted under 35 U.S.C. 154(b) by 337 days.

(21) Appl. No.: 11/156,266

(22) Filed: Jun. 17, 2005

(65) Prior Publication Data
US 2006/0284255 A1 Dec. 21, 2006

(51) Int. Cl.
*H01L 27/092* (2006.01)
*H01L 21/336* (2006.01)

(52) U.S. Cl. .............................. 257/369; 257/E21.632; 257/E21.336

(58) Field of Classification Search ................. 257/338, 257/368–369, 274, E27.057, E21.611, E21.612, 257/E21.632
See application file for complete search history.

(56) References Cited

U.S. PATENT DOCUMENTS

| 6,413,802 | B1 | 7/2002 | Hu et al. | |
| 6,909,151 | B2* | 6/2005 | Hareland et al. | 257/369 |
| 2002/0063292 | A1* | 5/2002 | Armstrong et al. | 257/367 |
| 2006/0057787 | A1* | 3/2006 | Doris et al. | 438/153 |
| 2006/0180866 | A1* | 8/2006 | Zhu et al. | 257/368 |
| 2006/0246672 | A1* | 11/2006 | Chen et al. | 438/301 |

OTHER PUBLICATIONS

Bourdelle et al., "*Smart Cut Transfer of 300 mm (110) and (100) Si Layers for Hybrid Orientation Technology*", 2004 IEEE International SOI confrence, Oct. 2004, pp. 98-99.
Chan et al., "*On the Integration of CMOS with Hybrid Crystal Orientation*", 2004 Symposium on VLSI Technology Digest of Technical Papers, IEEE, pp. 160-161.

(Continued)

*Primary Examiner*—Lynne A. Gurley
*Assistant Examiner*—Colleen A Matthews
(74) *Attorney, Agent, or Firm*—Withrow & Terranova, P.L.L.C.

(57) ABSTRACT

Performance of a complementary metal-oxide-semiconductor (CMOS) device having n-channel MOS transistors and p-channel MOS transistors is enhanced by providing a single capping layer overlying the MOS transistors with the single capping layer inducing stress in the transistor channel regions to enhance carrier mobility. The n-channel transistor is preferably fabricated in silicon having a (100) crystalline channel surface orientation, and the p-channel transistor is preferably fabricated in silicon having a (110) channel surface crystalline orientation. A tensile stress in the single capping layer induces tensile stress in the channel of the (100) n-channel transistor thereby enhancing the mobility of electrons while tensile stress in the single capping layer induces compressive stress in the channel of the (110) p-channel transistor thereby enhancing the mobility of holes. Alternatively, the n-channel transistor is fabricated in silicon having a (110) crystalline channel surface orientation, and the p-channel transistor is fabricated in silicon having a (100) channel surface crystalline orientation. A compressive stress in the single capping layer induces tensile stress in the channel of the (110) n-channel transistor thereby enhancing the mobility of electrons while compressive stress in the single capping layer induces compressive stress in the channel of the (100) p-channel transistor thereby enhancing the mobility of holes.

22 Claims, 4 Drawing Sheets

OTHER PUBLICATIONS

Doris et al., "*A Simplified Hybrid Orientation Technology (Shot) for High Performance CMOS*", 2004 Symposium on VLSI Technology Digest of Technical Papers, IEEE, pp. 86-87.

Shin et al., "*Effect of Tensile Capping Layer on #-D Stress Profiles in FinFET Channels*", 2005 Device Research Conference at UC Santa Barbara. Jun. 20-22, 2005, 2 pages.

Andrieu, F. et al., "Impact of Mobility Boosters (XsSOI, CESL, TiN Gate) on the Performance of <100> or <110> Oriented FDSOI cMOSFETs for the 32nm Node," 2007 Symposium on VLSI Technology Digest of Technical Papers, Jun. 12, 2007, pp. 50-51, Kyoto, Japan.

* cited by examiner

COMPLEMENTARY FIELD-EFFECT TRANSISTORS HAVING ENHANCED PERFORMANCE WITH A SINGLE CAPPING LAYER

BACKGROUND OF THE INVENTION

This invention relates generally to field effect transistors (FETs), and more particularly the invention relates to use of a stressed capping layer to enhance the performance of complementary metal-oxide-semiconductor (CMOS) integrated-circuit (IC) devices.

CMOS IC devices comprise n-channel (NMOS) and p-channel (PMOS) transistors which toggle on-off in a complementary fashion in response to input voltage signals. The transistors can have a planar structure, in which the surfaces of the source, channel, and drain regions are substantially located in a single plane, as in a conventional bulk-silicon (bulk-Si) MOSFET or silicon-on-insulator (SOI) MOSFET, or the transistors can have a vertical structure such as in the double gate FinFET structure as described in U.S. Pat. No. 6,413,802.

Transistor performance depends on mobile carrier (hole or electron) mobility. Strained-silicon technologies have been widely investigated to enhance the performance of CMOS devices. In particular, strain induced by the use of a stressed $SiN_x$ capping layer is advantageous because of its process simplicity and its extendibility from bulk-Si to SOI MOSFETs. However, it is difficult to enhance the performance of both n-channel and p-channel devices simultaneously, because tensile stress is required in the n-channel MOSFET channel, whereas uniaxial compressive stress is required in the p-channel MOSFET channel, to enhance carrier mobility.

The present invention is directed to the fabrication of a CMOS device in which the performance of both n-channel and p-channel transistors can be enhanced with a common capping layer and to the resulting structure.

SUMMARY OF THE INVENTION

In accordance with the invention, a stressed film or capping layer is formed over the source, gate stack (comprising the channel, gate dielectric layer or layers, and the gate electrode layer or layers), and drain regions of both n-channel and p-channel MOSFETs in a CMOS device to enhance their performance.

More particularly, in one embodiment, the NMOS transistor is fabricated in silicon having a (100) surface crystalline orientation, and the PMOS transistor is fabricated in silicon having a (110) surface crystalline orientation. Such a combination of surface crystalline orientations can be realized in a hybrid substrate having multiple layers of silicon with planes of different crystallographic orientation or by simple rotation of the layouts of vertical transistors formed from a single layer of silicon. For a (100) surface crystalline orientation, a tensile film or capping layer can induce tensile stress in the transistor channel region, which improves electron mobility in the stressed silicon. Conversely, for a (110) surface crystalline orientation, a tensile film or capping layer can induce compressive stress in the transistor channel region which improves hole mobility in the stressed silicon.

In another embodiment, the invention employs a tensile film or capping layer formed over vertical n-channel and p-channel transistors with (100) channel surface crystalline orientation. The stress in the film or capping layer over the p-channel transistors can be selectively relieved by a masked ion implantation step.

In another embodiment, the invention employs a compressive film or capping layer formed over vertical n-channel and p-channel transistors with (100) channel surface crystalline orientation. The stress in the film or capping layer over the n-channel transistors can be selectively relieved by a masked ion implantation step.

In another embodiment, the invention employs a compressive film or capping layer formed over vertical n-channel and p-channel transistors with (110) channel surface crystalline orientation. The stress in the film or capping layer over the n-channel transistors can be selectively relieved by a masked ion implantation step.

The invention and objects and features thereof will be more readily apparent from the following detailed description and appended claims when taken with the drawings.

DETAILED DESCRIPTION OF ILLUSTRATIVE EMBODIMENTS

The present invention can be implemented with a single sequence of manufacturing process steps to enhance performance in both n-channel MOSFETs and p-channel MOSFETs in a CMOS device. In one embodiment, the n-channel transistors have (100) channel surface crystalline orientation, and the p-channel transistors have (110) channel surface crystalline orientation. A tensile film or capping layer overlying the source, gate stack, and drain regions of the transistors will then induce tensile stress in the channel of (100) n-channel transistors and will induce compressive stress in the channel of (110) p-channel transistors, which respectively enhances the mobilities of electrons and holes in the n-channel and the p-channel MOSFETs.

Figure 1:
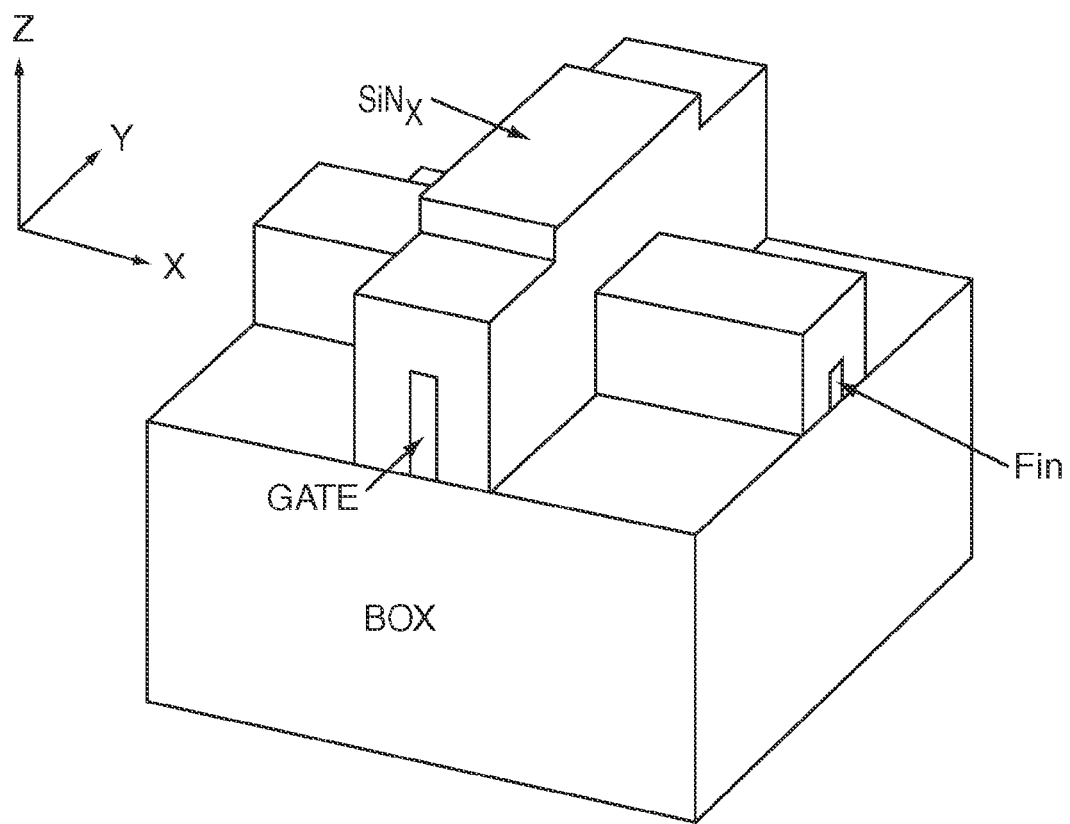
FIG. 1 is a perspective view of a FinFET transistor with a stressed capping layer in accordance with the invention.

FIG. 1 is a perspective view of a FinFET transistor in which the invention can be practiced. As described in detail in U.S. Pat. No. 6,413,802, supra, the source, S, and the drain, D, are connected by a fin-shaped channel with a gate electrode, G, extending over the fin-shaped channel and separated therefrom by a suitable gate dielectric such as $SiO_2$ or $SiO_xN_y$. The gate electrode can comprise doped polycrystalline silicon or silicon-germanium which can be partially or fully silicided, or metallic materials. A stressed layer of $SiN_x$ is formed over the entire transistor structure and induces stress in the channel region depending on surface crystalline orientation of the channel.

Figure 2:
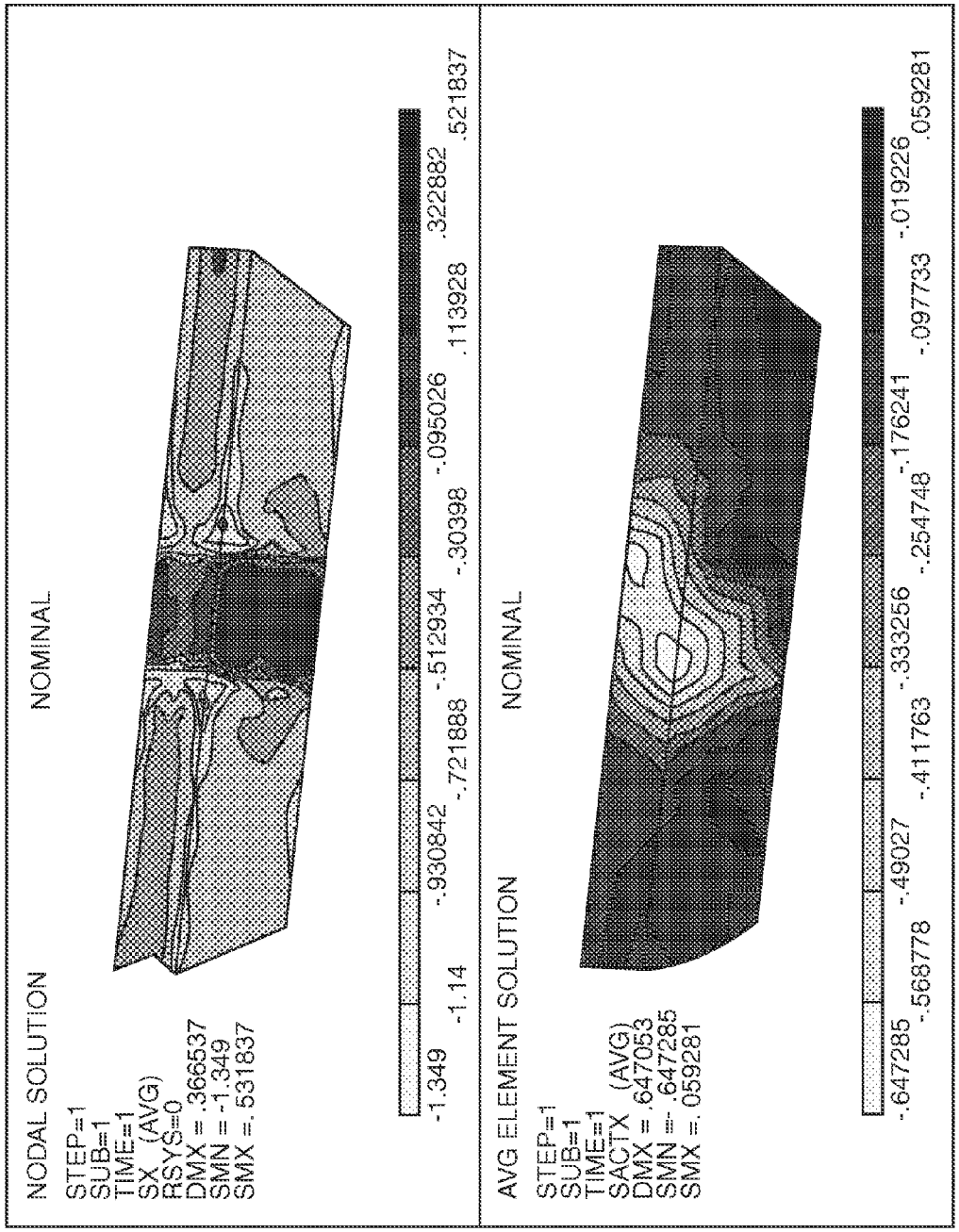
FIG. 2 illustrates 3-D stress profiles within silicon films in (100) silicon and in (110) silicon.

Table 1 summarizes FinFET parameters in specific embodiments studied. In this study, a 100 nm-thick $SiN_x$ capping layer has uniform hydrostatic tensile stress of 1 GPa. The bottom, left, and right surfaces in FIG. 1 are constrained to zero displacement. The bottom surface is the bottom of the 400 nm-thick buried oxide. The 3-D profiles of stress parallel to the direction of current flow ($\sigma_{xx}$) are shown in FIG. 2. For FinFETs with (100) sidewall surface orientation, tensile $\sigma_{xx}$ (0.24 GPa average) is induced in the side channels. In contrast, for FinFETs with (110) sidewall surface orientation, compressive $\sigma_{xx}$ (−0.35 GPa average) is induced in the side channels.

TABLE I

FinFET parameters used in this study.
(HAR = High Aspect Ratio)

|  | (100) nominal | (100) HAR | (110) nominal | (110) HAR |
|---|---|---|---|---|
| $T_{SiN}$ [nm] | 100 | 100 | 100 | 100 |
| Fin width [nm] | 50 | 25 | 50 | 25 |
| $T_{Fin}$ [nm] | 50 | 100 | 50 | 100 |
| Gate Length [nm] | 50 | 50 | 50 | 50 |
| $T_{Gate}$ [nm] | 150 | 150 | 150 | 150 |
| $T_{BOX}$ [nm] | 400 | 400 | 400 | 400 |
| Orientation | (100) | (100) | (110) | (110) |

Figure 3A:
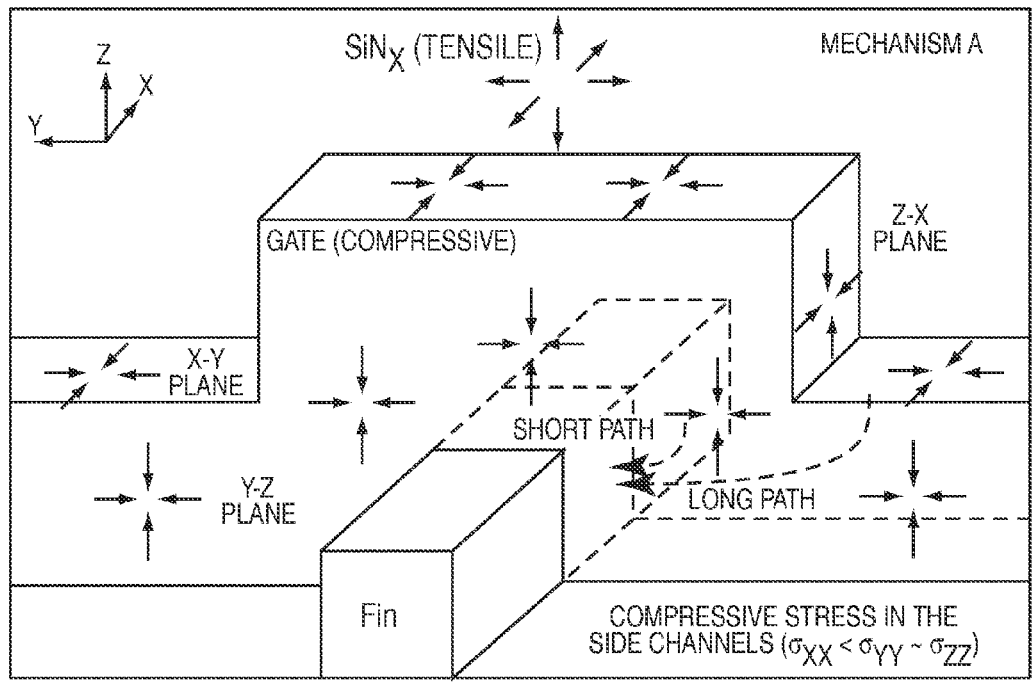
FIGS. 3(a) and 3(b) illustrate stress transfer mechanisms through a gate stack and through source/drain regions for inducing in the channel region compressive stress and tensile stress, respectively, and the resulting net stress depending in part on surface crystalline orientation.
Figure 3B:
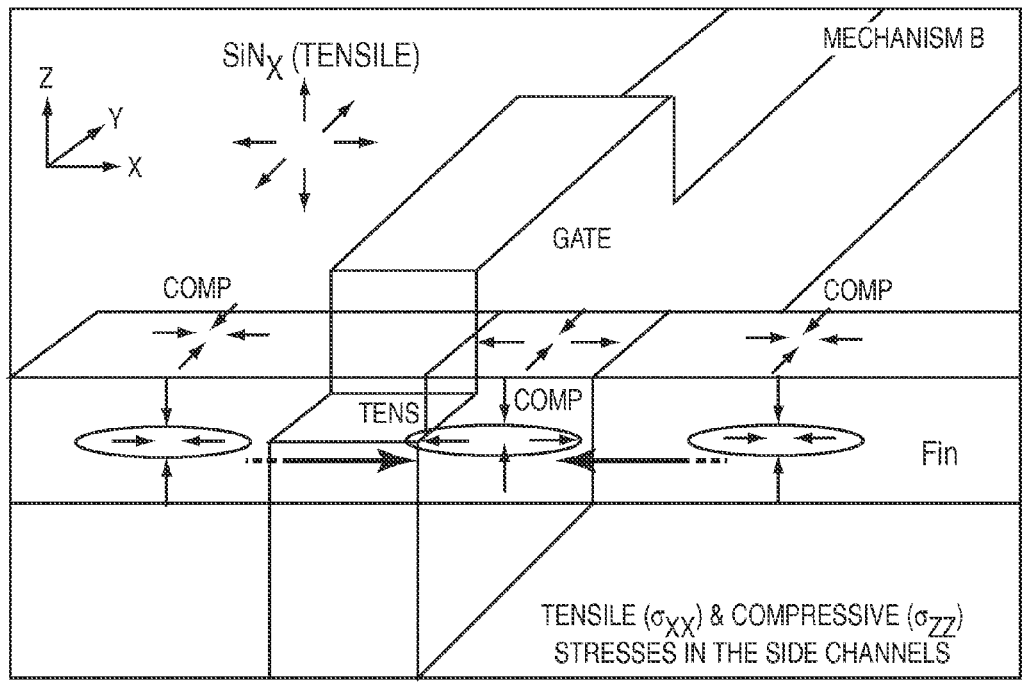

The effect of the fin sidewall crystalline orientation on $\sigma_{xx}$ is explained with the aid of FIG. 3 as follows. There are two pathways for transfer of mechanical stress from the capping layer to the channel. First, stress can be transferred directly through the gate stack (Mechanism A). In this case, a tensile capping layer induces compressive $\sigma_{xx}$ in the sides of the fin (side channels). The amount of induced stress depends on the distance between the capping layer and the fin, that is the distance between the side channels and the planes of the gate surfaces (x-y, y-z and z-x planes). Thus, $\sigma_{xx}$ induced by this mechanism is smaller at the bottom of the fin than at the top of the fin, due to the non-zero thickness of the gate layer (FIG. 3a). Second, stress can be transferred through the source/drain (S/D) regions (Mechanism B). In this case, tensile stress is induced in the side channels because the capping layer induces compressive stress in the S/D regions (FIG. 3b). Higher compressive stress in the S/D regions results in commensurately higher tensile stress in the channel region. Because (110) Si has a higher Young's modulus (E110=168.0 GPa) than does (100) Si (E100=129.5 GPa), it is more difficult to transfer stress from a capping layer to a (110) Si surface, so that Mechanism B yields lower tensile stress for a (110) fin. The stress distribution in the channel is determined by the superposition of the two mechanisms. Due to the anisotropic Young's modulus, the net $\sigma_{xx}$ induced within a (100) fin is tensile (dominated by Mechanism B), whereas the net $\sigma_{xx}$ induced within a (110) fin is compressive (dominated by Mechanism A). The strength of Mechanism A is increased for fins with larger aspect ratio, so that the induced $\sigma_{xx}$ is more tensile (or less compressive). Stresses $\sigma_{yy}$ and $\sigma_{zz}$ induced parallel to the y- and z-directions, respectively, are also determined by the combination of these two stress-transfer mechanisms.

Figure 4:
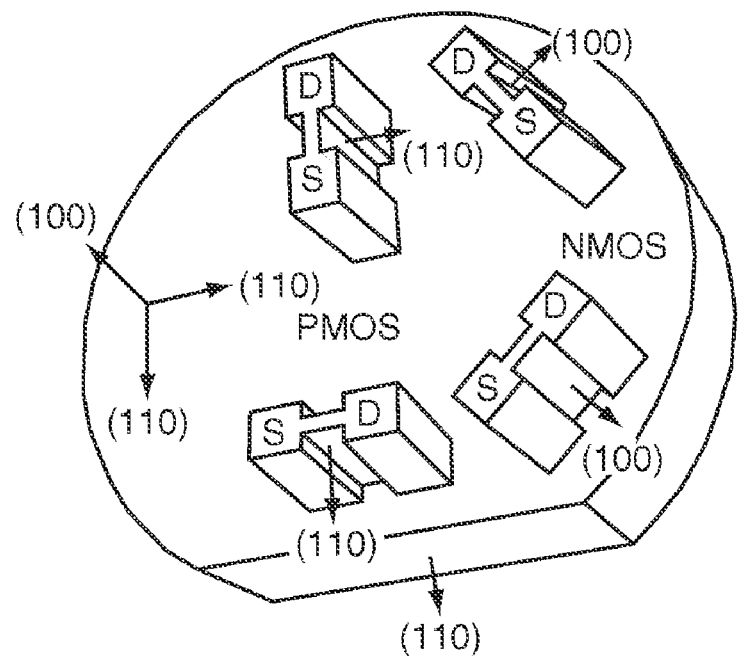
FIG. 4 is a schematic diagram illustrating channel surface orientation for FinFETs depending on substrate orientation.

These different crystalline orientations can be easily realized for FinFETs by simple rotation of the transistor layout. FIG. 4 is a schematic diagram to illustrate that the channel surface orientation of a FinFET can be adjusted by changing layout orientation on a substrate. If a (100) substrate is used, then a FinFET fabricated with the fin oriented either parallel or perpendicular to the wafer flat/notch will have (110) channel surfaces, and a FinFET fabricated with the fin oriented at a 45° angle to the wafer flat/notch will have (100) channel surfaces.

Figure 5:
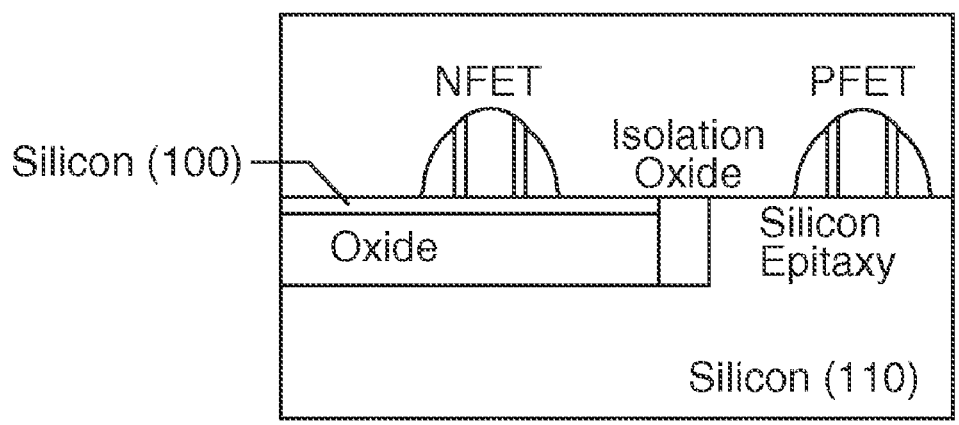
FIG. 5 is a cross-sectional scanning electron micrograph of planar n-channel and p-channel MOSFETs fabricated in a hybrid orientation substrate.

For planar MOSFETs, a hybrid substrate comprising multiple layers of silicon with planes lying in different crystallographic orientations can be utilized, as shown in FIG. 5, which is a cross-sectional scanning electron micrograph of planar n-channel and p-channel MOSFETs fabricated on the hybrid-orientation substrate. The p-channel transistor is formed in silicon which is epitaxially grown from the (110) silicon substrate, whereas the n-channel transistor is formed in a layer of silicon with different crystalline orientation than the silicon substrate, thereby providing a (100) surface. It should be noted that conversely a (100) silicon substrate can be used with a layer of (110) silicon for the formation of n-channel and p-channel MOSFETs, respectively.

The simulation results suggest that it may be preferable to simultaneously enhance the performance of planar (100) n-channel MOSFETs and (110) p-channel MOSFETs, such as used in IBM's hybrid orientation technology, with a single tensile capping layer. However, for a vertical transistor structure such as the FinFET, the other two stress components, $\sigma_{yy}$ (vertical to the channel surface) and $\sigma_{zz}$ (across the channel width) can be significant and their effect on mobility must be taken into account. Considering the percent change in mobility per 1 GPa stress along each direction, calculated based on a simple piezoresistance model, the effect of a 1 GPa tensile $SiN_x$ capping layer on n-channel and p-channel FinFET mobilities are summarized in Table II. For example, 29% mobility enhancement for a (100) n-FinFET with nominal fin aspect ratio is expected based on the simple calculation (1+0.24×0.3)×(1+0.79×0.5)×(1−0.68×0.2)=1.29. The results show that only (100) n-channel FinFET performance can be enhanced by the tensile capping layer, due to the induced tensile $\sigma_{xx}$ and compressive $\sigma_{yy}$. Although hole mobility is enhanced by compressive $\sigma_{xx}$ for a (110) fin, compressive $\sigma_{zz}$ results in net 56% degradation in hole mobility for a (110) p-channel FinFET. $\sigma_{zz}$ is greater for a high-aspect-ratio (HAR) fin, so that lower performance is expected for both n-channel and p-channel FinFETs regardless of the fin orientation.

TABLE II

Summary of 1 GPa tensile capping layer effect on carrier mobilities.

|  | % change in mobility per GPa[7] | | | | ANSYS Simulation: Average $\sigma$ on the side channels [GPa] | | | |
|---|---|---|---|---|---|---|---|---|
|  | Tensile | | Compressive | | (100) | | (110) | |
| Stress in Channel | NMOS | PMOS | NMOS | PMOS | Nominal | HAR | Nominal | HAR |
| $\sigma_{xx}$ (along channel) | 30% | −70% | −30% | 70% | 0.24 | 0.26 | −0.35 | −0.3 |
| $\sigma_{yy}$ (vertical to channel) | −50% | 1% | 50% | −1% | −0.79 | −0.73 | −0.74 | −0.84 |
| $\sigma_{zz}$ (across channel) | 20% | 70% | −20% | −70% | −0.68 | −1.13 | −0.92 | −1.28 |
| Final % change in mobility for NMOS | | | | | 29% | 14% | 0% | −4% |
| Final % change in mobility for PMOS | | | | | −56% | −83% | −56% | −88% |

TABLE III

Summary of 1GPa compressive capping layer effect on carrier mobilities.

| ANSYS Simulation: Average σ on the side channels [GPa] +: tensile/−: compressive | Compressive capping layer (1GPa) | | | |
| --- | --- | --- | --- | --- |
| | (100) | | (110) | |
| | Nominal | HAR | Nominal | HAR |
| $\sigma_{xx}$ (along channel) | −0.24 | −0.26 | 0.35 | 0.3 |
| $\sigma_{yy}$ (vertical to channel) | 0.79 | 0.73 | 0.74 | 0.84 |
| $\sigma_{zz}$ (across channel) | 0.68 | 1.13 | 0.92 | 1.28 |
| Final % change in mobility for NMOS | −36.2% | −28.2% | −17.6% | −20.6% |
| Final % change in mobility for PMOS | 73.8% | 113.2% | 25% | 51% |

Considering the percent change in mobility per 1 GPa stress along each direction, calculated based on a simple piezoresistance model, the effect of a 1 GPa compressive $SiN_x$ capping layer on n-channel and p-channel FinFET mobilities are summarized in Table III. The results show that p-channel FinFET performance can be enhanced by the compressive capping layer, more significantly (by a factor greater than 2) for a fin with (100) surface crystalline orientation. Thus, although the hole mobility in unstrained silicon is higher (by a factor of ~2) for a (110) surface as compared to a (100) surface [Leland Chang, Meikei leong, and Min Yang, "CMOS circuit performance enhancement by surface orientation optimization," *IEEE Transactions on Electron Devices*, vol. 51, pp. 1621-1627, 2004], the performance of a p-channel FinFET capped with a compressive capping layer can be highest for a (100) fin.

Thus, it is seen that the invention is applicable to different MOSFET structures, including conventional planar transistors and to vertical structures such as the FinFET. Induced stress depends on crystalline orientation of the transistor channel surface, which results in either net tensile stress or net compressive stress in the channel region, as desired.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A complementary metal-oxide-semiconductor (CMOS) device comprising:
    a) a n-channel field-effect transistor (nFET) having a gate electrode overlying a channel region between source and drain regions,
    b) a p-channel field-effect transistor (pFET) having a gate electrode overlying a channel region between source and drain regions, and
    c) a single capping layer having a single stress, the single capping layer overlying both the nFET and pFET, wherein the single capping layer induces stress in the nFET channel region so as to improve electron mobility, and induces stress in the pFET channel region so as to improve hole mobility.

2. The CMOS device as defined by claim 1 wherein at least one of the nFET and pFET transistors is a planar structure.

3. The CMOS device as defined by claim 1 wherein the single capping layer comprises silicon nitride.

4. The CMOS device as defined by claim 1 wherein the single capping layer is tensile.

5. The CMOS device as defined by claim 4 wherein the nFET is fabricated in silicon having (100) channel surface crystalline orientation, and the pFET is fabricated in silicon having (110) channel surface crystalline orientation.

6. The CMOS device as defined by claim 5 wherein the transistors are fabricated in a hybrid silicon substrate comprising multiple layers of silicon with planes lying in different crystallographic orientations.

7. The CMOS device as defined by claim 5 wherein at least nFET is a vertical transistor.

8. The CMOS device as defined by claim 1 wherein the single capping layer is compressive.

9. The CMOS device as defined by claim 8 wherein at least pFET is a vertical transistor.

10. The CMOS device as defined by claim 8 wherein the nFET is fabricated in silicon having (110) channel surface crystalline orientation, and the pFET is fabricated in silicon having (100) channel surface crystalline orientation.

11. The CMOS device as defined by claim 10 wherein the transistors are fabricated in a silicon substrate with each transistor oriented on the substrate to have the designated crystalline orientation.

12. The CMOS device as defined by claim 10 wherein the transistors are fabricated in a hybrid silicon substrate comprising multiple layers of silicon with planes lying in different crystallographic orientations.

13. The CMOS device as defined by claim 12 wherein the transistors are fabricated in a silicon substrate with each transistor oriented on the substrate to have the designated crystalline orientation.

14. A method of enhancing the performance of a complementary metal-oxide-semiconductor (CMOS) device comprising the steps of:
    a) fabricating a n-channel MOS transistor (nFET) in silicon having a first channel surface crystalline orientation, the n-channel MOS transistor having a gate electrode overlying a channel between source and drain regions,
    b) fabricating a p-channel MOS transistor (pFET) in silicon having a second channel surface crystalline orientation, the p-channel MOS transistor having a gate electrode overlying a channel between source and drain regions, and
    c) forming a single stressed capping layer having a single stress, the single capping layer overlying both the nFET and pFET, wherein the single capping layer induces stress in the nFET channel region so as to improve electron mobility, and induces stress in the pFET channel region so as to improve hole mobility.

15. The method of claim 14 wherein the transistors are fabricated in a silicon substrate with each transistor oriented on the substrate to have the designated crystalline orientation.

16. The method of claim 14 wherein the capping layer comprises silicon nitride.

17. The method of claim 14 wherein the n-channel MOS transistor is fabricated in silicon having (100) channel surface crystalline orientation, and the p-channel MOS transistor is fabricated in silicon having (110) channel surface crystalline orientation.

18. The method of claim 17 wherein the capping layer is tensile.

19. The method of claim 17 wherein the transistors are fabricated in a hybrid silicon substrate comprising multiple layers of silicon with planes lying in different crystallographic orientations.

20. The method of claim 14 wherein the n-channel MOS transistor is fabricated in silicon having (110) channel surface crystalline orientation, and the p-channel MOS transistor is fabricated in silicon having (100) channel surface crystalline orientation.

21. The method of claim 20 wherein the transistors are fabricated in a hybrid silicon substrate comprising multiple layers of silicon with planes lying in different crystallographic orientations.

22. The method of claim 20 wherein the capping layer is compressive.

* * * * *